United States Patent
Huang

(10) Patent No.: US 8,710,920 B2
(45) Date of Patent: Apr. 29, 2014

(54) CHARGE DOMAIN FILTER AND METHOD THEREOF

(75) Inventor: Ming-Feng Huang, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 29 days.

(21) Appl. No.: 13/364,245

(22) Filed: Feb. 1, 2012

(65) Prior Publication Data
US 2013/0154725 A1    Jun. 20, 2013

(30) Foreign Application Priority Data

Dec. 14, 2011   (TW) ............................. 100146228 A

(51) Int. Cl.
*H03K 5/00*     (2006.01)
(52) U.S. Cl.
USPC .......................................... 327/554; 327/552
(58) Field of Classification Search
USPC ................... 327/551–559, 336–337; 708/819
See application file for complete search history.

(56) References Cited

U.S. PATENT DOCUMENTS

| | | | |
|---|---|---|---|
| 6,856,925 B2 | 2/2005 | Muhammad et al. | |
| 7,006,813 B2 | 2/2006 | Staszewski et al. | |
| 7,327,182 B2 | 2/2008 | Dosho et al. | |
| 7,535,288 B2 | 5/2009 | Iida | |
| 7,636,012 B2 | 12/2009 | Iida | |
| 7,907,004 B2 | 3/2011 | Yoshizawa et al. | |
| 7,932,773 B2 * | 4/2011 | Iida et al. | 327/551 |
| 8,067,972 B2 * | 11/2011 | Iida et al. | 327/337 |
| 2008/0007326 A1 | 1/2008 | Iida | |
| 2008/0088389 A1 | 4/2008 | Iida | |
| 2009/0015306 A1 | 1/2009 | Yoshizawa et al. | |
| 2009/0021297 A1 | 1/2009 | Yoshizawa et al. | |
| 2009/0134916 A1 | 5/2009 | Iida et al. | |
| 2009/0134938 A1 | 5/2009 | Iida et al. | |
| 2009/0160577 A1 | 6/2009 | Yoshizawa et al. | |
| 2009/0161801 A1 | 6/2009 | Huang et al. | |
| 2013/0080497 A1 * | 3/2013 | Nestler et al. | 708/821 |

FOREIGN PATENT DOCUMENTS

| | | |
|---|---|---|
| CN | 101447779 | 6/2009 |
| TW | 201119222 | 6/2011 |

OTHER PUBLICATIONS

Jakonis et al., "A 2.4-GHz RF Sampling Receiver Front-End in 0.18-μm CMOS", IEEE Journal of Solid-State Circuits, Jun. 2005, pp. 1265-1277, vol. 40, No. 6.

(Continued)

*Primary Examiner* — Dinh T. Le
(74) *Attorney, Agent, or Firm* — Jianq Chyun IP Office

(57) ABSTRACT

A charge domain filter (CDF) and a method thereof are provided. The CDF includes an amplifier, a first switch-capacitor network (SCN), a second SCN, a third SCN and a fourth SCN. Input terminals of the first and the second SCNs are coupled to first and second output terminals of the amplifier, respectively. Input and output terminals of the third SCN are coupled to output terminals of the first and the second SCNs, respectively. Input and output terminals of the fourth SCN are coupled to output terminals of the second and the first SCNs, respectively. A mode control terminal of the third SCN receives a first mode signal to set an impulse response mode of the third SCN. A mode control terminal of the fourth SCN receives a second mode signal to set an impulse response mode of the fourth SCN.

40 Claims, 10 Drawing Sheets

(56) References Cited

OTHER PUBLICATIONS

Park et al., "Non-Decimation FIR Filter for Digital RF Sampling Receiver with Wideband Operation Capability", IEEE Radio Frequency Integrated Circuits Symposium, Jun. 2009, pp. 478-490.

Yoshizawa et al., "An Equalized Ultra-Wideband Channel-Select Filter with a Discrete-Time Charge-Domain Band-Pass IIR Filter", IEEE 2007 Custom Intergrated Circuits Conference, 2007, pp. 707-710.

Yoshizawa et al., "A Gain-Boosted Discrete-Time Charge-Domain FIR LPF with Double-Complementary MOS Parametric Amplifiers", IEEE International Solid-State Circuits Conference, Feb. 4, 2008, pp. 68-69, p. 596.

Huang et al., "A Discrete-Time AAF with Clock-Efficient Charge-Domain Filter for High Attenuation and Bandwidth", IEEE Asian Solid-State Circuits Conference, Nov. 16-18, 2009, pp. 41-44.

Huang et al., "A Quadrature Charge-Domain Filter with Frequency Down-Conversion and Filtering for RF Receivers", IEEE Radio Frequency Integrated Circuits Symposium, Jun. 2009, pp. 547-550.

Huang et al., "A Cascade Non-Decimation Charge-Domain Filter with Noise-Folding Reduction", IEEE Asian Solid-State Circuits Conference, Nov. 8-10, 2010, pp. 1-4.

Ming-Feng Huang, "A Quadrature Charge-Domain Filter with an Extra In-Band Filtering for RF Receivers", IEEE Radio Frequency Integrated Circuits Symposium, 2010, pp. 31-34.

Geis et al., "A 0.5 mm2 Power-Scalable 0.5-3.8-GHz CMOS DT-SDR Receiver With Second-Order RF Band-Pass Sampler", IEEE Journal of Solid-State Circuits, Nov. 2010, pp. 2375-2387.

Ming-Feng Huang, "A Discrete-Time Charge-Domain Filter with Bandwidth Calibration for LTE Application", IEEE Custom Integrated Circuits Conference, Sep. 19-21, 2011, pp. 1-4.

\* cited by examiner

CHARGE DOMAIN FILTER AND METHOD THEREOF

CROSS-REFERENCE TO RELATED APPLICATION

This application claims the priority benefit of Taiwan application serial no. 100146228, filed on Dec. 14, 2011. The entirety of the above-mentioned patent application is hereby incorporated by reference herein and made a part of this specification.

BACKGROUND

1. Technical Field

The disclosure relates to a filter, and more particularly to a charge domain filter (CDF).

2. Related Art

A conventional switch-capacitor network (SCN) is a common circuit in discrete time signal processing, which includes a plurality of switches and a plurality of capacitors. The SCN is commonly seen in the filter technology. Compared with the capacitor-resistor analog filter circuit, a filtering effect of the SCN mainly depends on size ratios among the capacitors. Even though the areas of the capacitors are changed because of the variations of the process, as the size ratios of the capacitors do not change with the variations of the process, the filtering effect of the SCN is still not changed. Therefore, the SCN is very suitable for being fabricated in a chip. However, a bandwidth compensation circuit is not used in most of the conventional CDFs, so the bandwidth is relatively narrow.

SUMMARY

A charge domain filtering apparatus and a method thereof are introduced herein to compensate for the bandwidth and mitigate the Sinc-function distortion.

An embodiment of the disclosure proposes a CDF, which includes an amplifier, at least one first SCN, at least one second SCN, at least one third SCN, and at least one fourth SCN. An input terminal of the first SCN is coupled to a first output terminal of the amplifier. An input terminal of the second SCN is coupled to a second output terminal of the amplifier. An input terminal of the third SCN is coupled to an output terminal of the first SCN. An output terminal of the third SCN is coupled to the output terminal of the second SCN. A mode control terminal of the third SCN receives a first mode signal to set an impulse response mode of the third SCN. An input terminal of the fourth SCN is coupled to an output terminal of the second SCN. An output terminal of the fourth SCN is coupled to an output terminal of the first SCN. A mode control terminal of the fourth SCN receives a second mode signal to set an impulse response mode of the fourth SCN.

Another embodiment of the disclosure proposes a method of a CDF, which includes: providing an amplifier, at least one first SCN, at least one second SCN, at least one third SCN and at least one fourth SCN, wherein an input terminal of the third SCN is coupled to an output terminal of the first SCN, and an input terminal of the fourth SCN is coupled to an output terminal of the second SCN; converting an input signal into a first input signal and a second input signal with the amplifier; sampling the first input signal with the at least one first SCN; sampling the second input signal with the at least one second SCN; summating an output of the first SCN and an output of the fourth SCN to obtain a first summation result; summating an output of the second SCN and an output of the third SCN to obtain a second summation result; sampling the first summation result with the at least one third SCN; sampling the second summation result with the at least one fourth SCN; setting an impulse response mode of the third SCN through a first mode signal, wherein a mode control terminal of the third SCN receives the first mode signal; and setting an impulse response mode of the fourth SCN through a second mode signal, wherein a mode control terminal of the fourth SCN receives the second mode signal.

Another embodiment of the disclosure proposes a CDF, which includes: an input amplifier, having a first output terminal and a second output terminal; at least one first SCN, having an input terminal coupled to a first output terminal of the input amplifier; at least one second SCN, having an input terminal coupled to a second output terminal of the input amplifier; at least one third SCN, having an input terminal coupled to an output terminal of the first SCN; at least one fourth SCN, having an input terminal coupled to an output terminal of the second SCN; a first output amplifier, having a first input terminal coupled to an output terminal of the third SCN, in which a second input terminal of the first output amplifier is coupled to an output terminal of the second SCN, and an output terminal of the first output amplifier serves as a first output terminal of the CDF; and a second output amplifier, having a first input terminal coupled to an output terminal of the fourth SCN, in which a second input terminal of the second output amplifier is coupled to an output terminal of the first SCN, and an output terminal of the second output amplifier serves as a second output terminal of the CDF.

Another embodiment of the disclosure proposes a method of a CDF, which includes: providing an input amplifier, at least one first SCN, at least one second SCN, at least one third SCN, at least one fourth SCN, a first output amplifier and a second output amplifier; converting an input signal into a first input signal and a second input signal with the input amplifier; sampling the first input signal with the at least one first SCN; sampling the second input signal with the at least one second SCN; sampling an output of the first SCN with the at least one third SCN; sampling an output of the second SCN with the at least one fourth SCN; receiving and amplifying an output of the third SCN and an output of the second SCN with the first output amplifier, so as to provide a first output of the CDF; and receiving and amplifying an output of the fourth SCN and an output of the first SCN with the second output amplifier, so as to provide a second output of the CDF.

Based on the CDF and the method thereof in the embodiments of the disclosure, the third and fourth SCNs are used to mitigate Sinc-function distortion of the first and second SCN. Therefore, the CDF having the bandwidth compensation can meet the required bandwidths.

In order to make the aforementioned and other objectives and advantages of the disclosure comprehensible, embodiments accompanied with figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
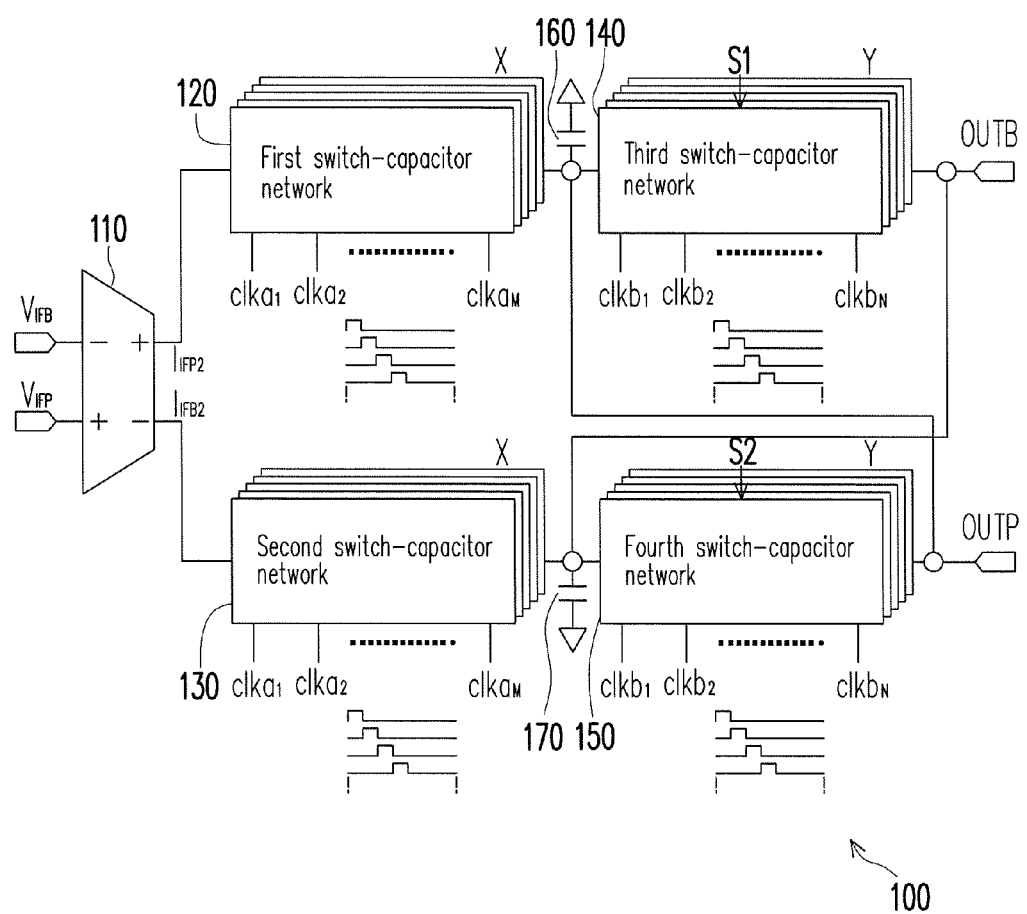
FIG. 1 is a schematic functional block diagram for illustrating a charge domain filtering apparatus according to an embodiment of the disclosure.

FIG. 1 is a schematic functional block diagram for illustrating a charge domain filtering apparatus 100 according to an embodiment of the disclosure. The CDF 100 includes an amplifier 110, at least one first SCN 120, at least one second SCN 130, at least one third SCN 140 and at least one fourth SCN 150. A first input terminal and a second input terminal of the amplifier 110 are used as input terminals of the CDF 100 to receive input signals $V_{IFP}$ and $V_{IFB}$, respectively. The amplifier 110 converts the input signals $V_{IFP}$ and $V_{IFB}$ into a first input signal and a second input signal. For example, the amplifier 110 can be a transconductance amplifier (TA), an operation amplifier (OP-AMP) or any circuit/apparatus capable of signal summation. The TA can convert the input signals $V_{IFP}$ and $V_{IFB}$ from voltages into a first input signal $I_{IFP2}$ and a second input signal $I_{IFB2}$ for the first SCN 120 and the second SCN 130.

In this embodiment, the number of the first SCNs 120 is X, the number of the second SCNs 130 is X, the number of the third SCNs 140 is Y, the number of the fourth SCNs 150 is Y, and X and Y are integers greater than 0. An input terminal of the first SCN 120 is coupled to a first output terminal of the amplifier 110 to receive/sample a current $I_{IFP2}$. An input tee of the second SCN 130 is coupled to a second output terminal of the amplifier 110 to receive/sample a current $I_{IFB2}$. An input terminal of the third SCN 140 is coupled to an output terminal of the first SCN 120 to receive/sample an output of the first SCN 120. An output terminal of the third SCN 140 is coupled to an output terminal of the second SCN 130. A mode control terminal of the third SCN 140 receives a first mode signal S1 to set an impulse response mode of the third SCN 140. An input terminal of the fourth SCN 150 is coupled to an output terminal of the second SCN 130. An output terminal of the fourth SCN 150 is coupled to an output terminal of the first SCN 120. A mode control terminal of the fourth SCN 150 receives a second mode signal S2 to set an impulse response mode of the fourth SCN 150. The output terminal of the third SCN 140 is used as a first output terminal OUTB of the CDF 100, whereas the output terminal of the fourth SCN 150 is used as a second output terminal OUTP of the CDF 100.

In this embodiment, the CDF 100 further includes a capacitor 160 and a capacitor 170. A first terminal of the capacitor 160 is coupled to an output terminal of the first SCN 120. A second terminal of the capacitor 160 is coupled to a reference voltage. A first terminal of the capacitor 170 is coupled to an output terminal of the second SCN 130. A second terminal of the capacitor 170 is coupled to a reference voltage. The reference voltage can be a ground voltage or other fixed voltages. However, according to the design demands of practical products, the capacitor 160 and the capacitor 170 may be implemented in many different ways. For example, in some embodiments, the capacitor 160 and the capacitor 170 can be a parasitic capacitor. In other embodiments, the capacitor 160 can be integrated to a summation capacitor inside the first SCN 120, whereas the capacitor 170 can be integrated to a summation capacitor inside the second SCN 130. In other embodiments, the capacitor 160 might be integrated to a summation capacitor inside the fourth SCN 150, whereas the capacitor 170 might be integrated to a summation capacitor inside the third SCN 140. The summation capacitor is illustrated below. Therefore, in different embodiments, the capacitor 160 and the capacitor 170 might be omitted.

The CDF 100 is used for reducing folding frequencies and current leakages of the SCN and used for compensating the Sine-function distortion. In this CDF 100, the sub SCNs inside the SCNs 120, 130 and the SCNs 140, 150, perform time-interleaving operations according to the clock signals $clka_1$~$clka_M$ or clock signals $clkb_1$~$clkb_N$, respectively, in which M and N are integers greater than 0. The clock signals $clka_1$~$clka_M$ through different phases drive the SCNs 120 and 130 in a time-interleaving manner, and the clock signals $clkb_1$~$clkb_N$ through different phases drive the SCNs 140 and 150 in a time-interleaving manner. The time-interleaving operations can reduce the folding frequency, filter the clock feed-through from the sub SCN, and mitigate the Sinc-function distortion. When the condition M=N is used, the SCNs 120, 130 and the SCNs 140, 150 may use the same clock pattern only without further requiring the clock waveforms. Therefore, the power current from the clock generation circuit can be saved. In other embodiments, M may be not equal to N.

For the SCN, in some embodiments, the SCNs 120 and 130 support a finite impulse response (FIR) filter or an infinite impulse response (IIR) filter. As the intrinsic distortion of the Sine-function results from the samplers in the SCNs, the bandwidths of the SCNs 120 and 130 are reduced. Therefore, the SCNs 140 and 150 mainly support another FIR or IIR filter, so as to counteract the distortion. In a FIR mode, the SCNs 140 and 150 provide the required frequency response to equalize the amplitude at a specific frequency, so that the CDF 100 acquires a flat bandwidth. As the process variations might affect the equalized amplitude, the IIR mode of the SCNs 140 and 150 can be enabled to adjust the level of the amplitude. Therefore, with the same clock pattern, the CDF 100 can implement the power equalizer. Additionally, if the SCNs 140 and 150 use a different sampling rate, that is, the sampling rate of the SCNs 140 and 150 is greater than or smaller than the sampling rate of the SCNs 120 and 130, the frequency equalized by the CDF 100 can be modulated. Therefore, the SCNs 140 and 150 vary the power level at a different frequency to implementation the frequency equalizer. Therefore, the CDF 100 can provide two-dimensional (2D) compensation in a frequency response graph.

Based on the above, in the embodiment of the disclosure, the CDF 100 uses a third SCN 140 and a fourth SCN 150 to mitigate the Sinc-function distortion of the first SCN 120 and the second SCN 130. The CDF 100 can implement X-axis (frequency) compensation and/or Y-axis (power or gain) compensation in the frequency response graph according to the design demands. The third SCN 140 and the fourth SCN 150 set an impulse response mode according to the mode signals S1 and S2, for example, set to a FIR mode or an IIR mode. In some embodiments, the third SCN 140 and the fourth SCN 150 provide a tunable-weight coefficient according to the mode signals S1 and S2 or change a power level to a required frequency according to a tunable sampling rate, so as to implementation the X-axis compensation (or referred to as the frequency equalizer). In other embodiments, the third SCN 140 and the fourth SCN 150 adjust the bandwidth of the IIR filter (or FIR filter) according to the mode signal to change the power to a required level, so as to implementation the Y-axis compensation (or referred to as the power equalizer). Therefore, the CDF 100 with the bandwidth compensation can meet the required bandwidth to mitigate the Sinc-function distortion.

Figure 2:
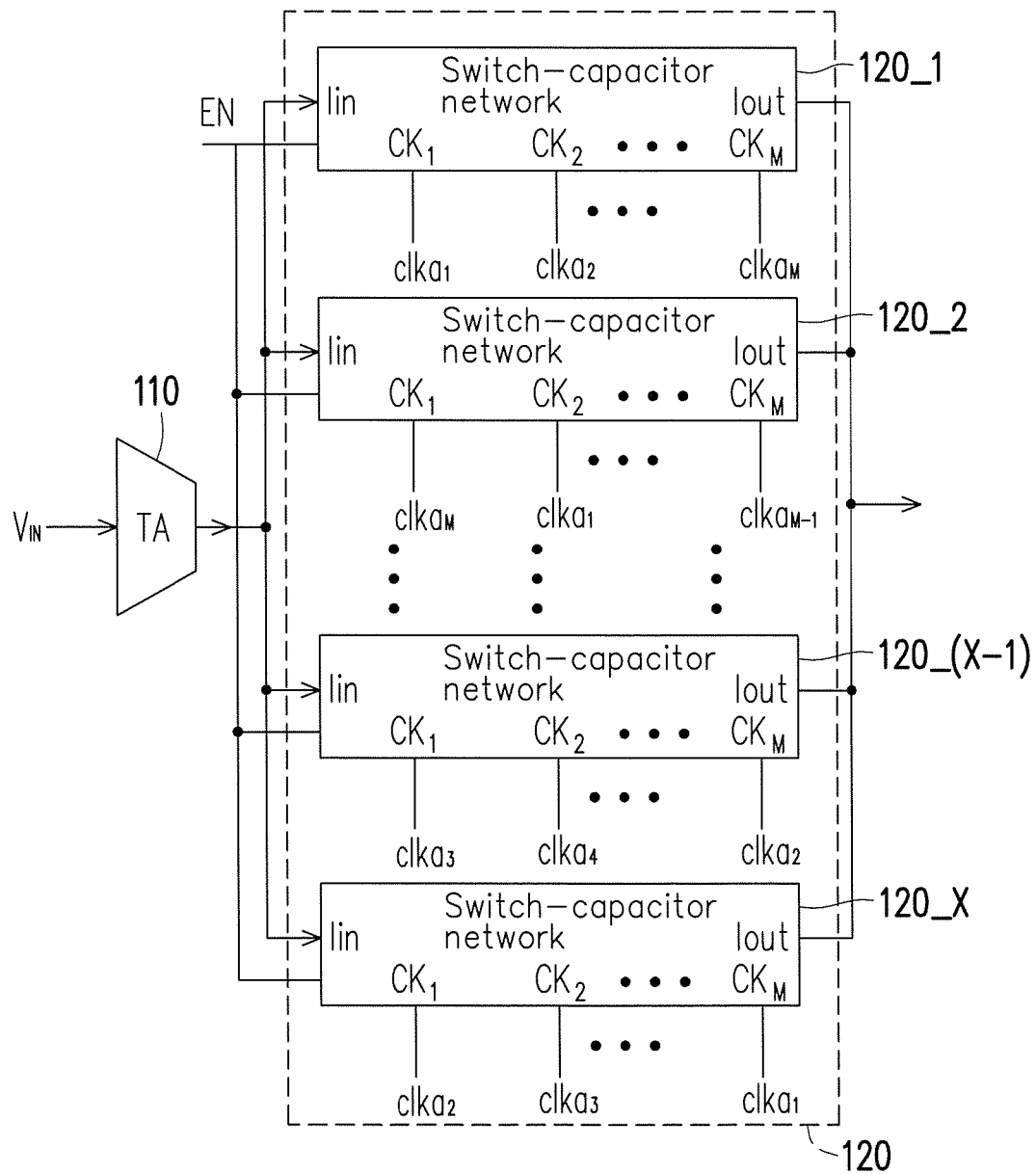
FIG. 2 is a schematic functional block diagram for illustrating an SCN in FIG. 1 according to this embodiment.

Any SCN or any CDF can be used to implementation the SCNs 120 and 130. For example, FIG. 2 is a schematic functional block diagram for illustrating the SCN 120 in FIG. 1 according to this embodiment. The SCN 130 can be referred to related illustration of the SCN 120. The SCN 120 includes a plurality of SCNs 120_1, 120_2, . . . , 120_(X−1), and 120_X. In this embodiment, the number X of the SCNs 120 is equal to the number M of the clock signals. In other embodiments, M can be equal to X. An input terminal of the amplifier 110 receives an input signal $V_{IN}$, for example, the input signals $V_{IFP}$ and $V_{IFB}$ shown in FIG. 1. An output terminal of the amplifier 110 is connected to input terminals Iin of the SCNs 120_1~120_X. The output terminals Iout of the SCNs 120_1~120_X are used as the output terminal of the SCN 120. The SCNs 120_1~120_X do not have to be implemented by circuits of the same type. For example, a part or all of the SCNs 120_1~120_X can be clock-efficient charge-domain filters (CECDFs). By designing the structures of the SCNs 120_1~120_X, the CDF 100 generates different filtering effects.

In this embodiment, a tap-length of the SCNs 120_1~120_X is M. That is to say, each of the SCNs 120_1~120_X has M clock input terminals $CK_1$, $CK_2$, . . . , and $CK_M$ to receive clock signals $clka_1$~$clka_M$, respectively. A clock generator provides the clock signals $clka_1$~$clka_M$ to the SCNs 120_1~120_X, in which the clock signals $clka_1$~$clka_M$ have different phases. Each SCN receives the clock signals $clka_1$~$clka_M$ in a different sequence. For example, the clock input terminals $CK_1$~$CK_M$ of the SCN 120_1 receive clock signals $clka_1$, $clka_2$, . . . , $clka_M$, respectively. The clock input terminals $CK_1$~$CK_M$ of the SCN 120_2 receive the clock signals $clka_M$, $clka_1$, $clka_2$, . . . , $clka_{(M-1)}$, respectively. Similarly, the clock input terminals $CK_1$~$CK_M$ of the SCN 120_(X−1) receive clock signals $clka_3$, $clka_4$, . . . , $clka_M$, $clka_1$, and $clka_2$, respectively. The clock input terminals $CK_1$-$CK_M$ of the SCN 120_X receive clock signals $clka_2$, $clka_3$, . . . , $clka_M$, and $clka_1$, respectively.

In this embodiment, the SCNs 120_1~120_X can be implemented in any manners, which are not limited thereto. For example, the SCNs 120_1~120_X can be implemented according to the related illustration of FIG. 3, FIG. 6 or FIG. 8.

Figure 3:
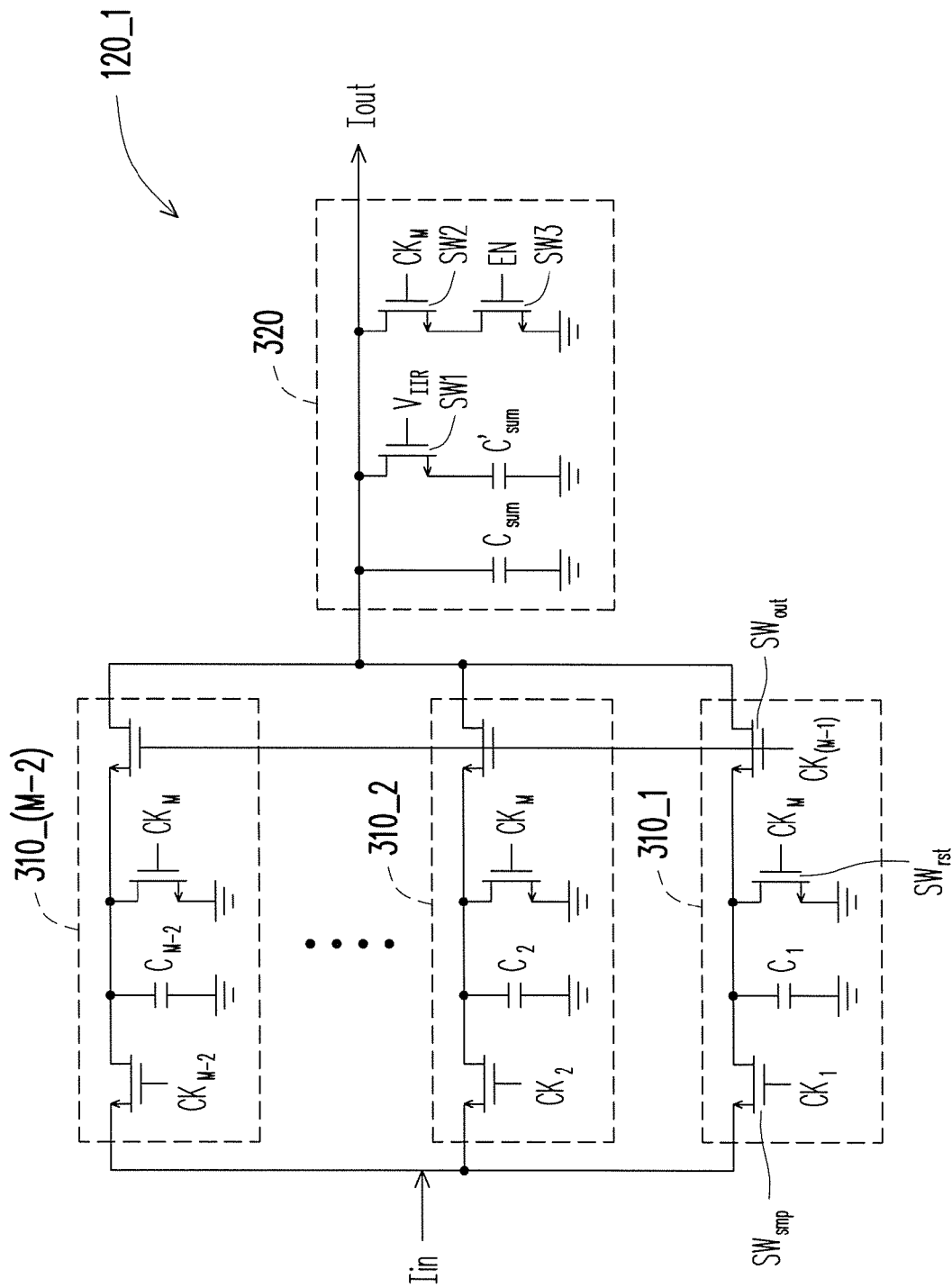
FIG. 3 is a schematic circuit diagram for illustrating a sub SCN in FIG. 2 according to this embodiment.

FIG. 3 is a schematic circuit diagram for illustrating the SCN 120_1 in FIG. 2 according to this embodiment. The implementation manners of other SCNs 120_2~120_X can be referred to the related illustration of the SCN 120_1. The SCN 120_1 includes a plurality of sampling units 310_1, 310_2, . . . , and 310_(M−2) and a summation unit 320. Sampling terminals of the sampling units 310_1~310_(M−2) are connected to an input terminal Iin of the SCN 120_1. Each of the plurality of sampling units 310_1~310_(M−2) samples the input terminal Iin of the SCN 120_1 at a different phase. An input terminal of the summation unit 320 is connected to output terminals of the plurality of sampling units 310_1~310_(M−2) to summate sampling results of the sampling units 310_1~310_(M−2) and output a summation result to an output terminal Iout of the SCN 120_1.

An implementation example of the sampling unit 310_1 is illustrated here. Other sampling units 310_2~310_(M−2) can be referred to related illustration of the sampling unit 310_1 and to the disclosed contents in FIG. 3. The sampling unit 310_1 includes a sampling switch SWsmp, a sampling capacitor $C_1$, a reset switch SWrst and an output switch SWout. A control terminal of the sampling switch SWsmp is connected to a clock input terminal $CK_1$ of the SCN 120_1 to receive a clock signal $clka_1$. A first terminal of the sampling switch SWsmp is used as an input terminal of the sampling unit 310_1 to be connected to an input terminal of the SCN 120_1. A first terminal of the sampling capacitor $C_1$ is connected to a second terminal of the sampling switch SWsmp. A first terminal of the reset switch SWrst is connected to a first terminal of the sampling capacitor $C_1$. A second terminal of the reset switch SWrst and a second terminal of the sampling capacitor $C_1$ are connected to a reference voltage (for example, a ground voltage). A control terminal of the reset switch SWrst is connected to a clock input terminal $CK_M$ of the SCN 120_1 to receive a clock signal $clka_M$. A control terminal of the output switch SWout is connected to a clock input terminal $CK_{(M-1)}$ of the SCN 120_1 to receive a clock signal $clkb_{(M-1)}$. A first terminal of the output switch SWout is connected to a first terminal of the sampling capacitor $C_1$. A second terminal of the output switch SWout is used as an output terminal of the sampling unit 310_1 to be connected to an input terminal of the summation unit 320.

Figure 4:
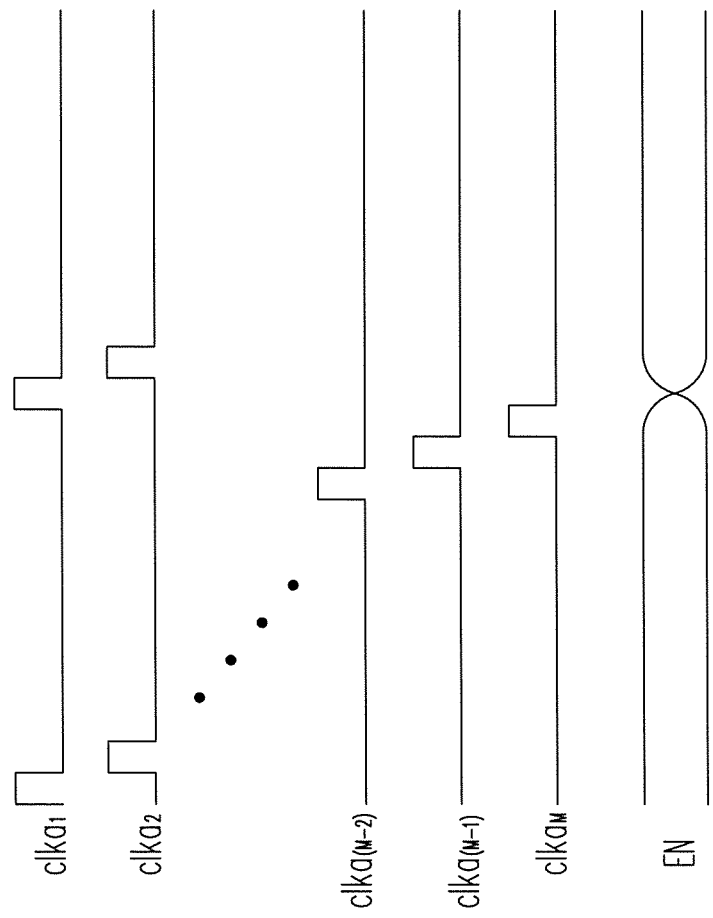
FIG. 4 is a schematic sequence chart for illustrating the signals of clock input terminals $CK_1$ to $CK_M$ and an enable signal EN in FIG. 3 according to an embodiment of the disclosure.

Control terminals of sampling switches of the sampling units 310_2~310 (M−2) are connected to clock input terminals $CK_2$~$CK_{(M-2)}$ of the SCN 120_1, respectively. FIG. 4 is a schematic sequence chart for illustrating clock signals $clka_1$~$clka_M$ and an enable signal EN in FIG. 1 and FIG. 2 according to an embodiment of the disclosure. Referring to FIG. 2 and FIG. 4, for the SCN 120_1, the clock input terminals $CK_1$~$CK_M$ of the SCN 120_1 receive the clock signals $clka_1$, $clka_2$, . . . , and $clka_M$, respectively. Referring to FIG. 3 and FIG. 4, the sampling units 310_1~310_(M−2) sample the input terminal Iin of the SCN 120_1 in turns according to a drive timing sequence of the clock input terminals $clka_1$~$clka_{(M-2)}$, and save the sampling results in the sampling capacitors $C_1$, $C_2$, . . . , and $C_{M-2}$. When all the sampling units 310_1~310_(M−2) finish sampling, the clock signal $clka_{(M-1)}$ of the clock input terminal $CK_{(M-1)}$ triggers the sampling units 310_1~310_(M−2) to output respective sampling results to the summation unit 320. After the sampling units 310_1~310_(M−2) output the respective sampling results to the summation unit 320, the clock signal $clka_{(M)}$ of the clock input terminal $CK_M$ triggers the sampling units 310_1~310_(M−2) to reset the respective sampling results to a certain initial value (for example, 0 volt).

As shown in FIG. 3, the summation unit 320 includes a summation capacitor $C_{sum}$, a switch SW1, a capacitor $C'_{sum}$, a switch SW2 and a switch SW3. A first terminal of the summation capacitor $C_{sum}$ is connected to output terminals of the sampling units 310_1~310_(M−2). When the output switches of the sampling units 310_1~310_(M−2) are turned on, the summation capacitor $C_{sum}$ can summate the sampling results of the sampling units 310_1~310_(M−2).

A first terminal of the switch SW1 is connected to output terminals of the sampling units 310_1~310_(M-2). A control terminal of the switch SW1 is controlled by the control signal $V_{IIR}$. A first terminal of the capacitor $C'_{sum}$ is connected to a second terminal of the switch SW1, whereas a second terminal of the capacitor $C'_{sum}$ is connected to a reference voltage (for example, a ground voltage). The control signal $V_{IIR}$ is used for selecting a specified bandwidth. As the control signal $V_{IIR}$ can control the switch SW1 to be turned on and off, a capacitance value of the summation capacitor $C_{sum}$ is equivalently changed. As an equivalent capacitance value of the summation capacitor $C_{sum}$ is changed, the required bandwidth can be changed. Therefore, the switch SW1 and the capacitor $C'_{sum}$ can also be referred to as a bandwidth programming circuit.

A first terminal of the switch SW2 is connected to a first tell final of the summation capacitor $C_{sum}$, whereas a control terminal of the switch SW2 is connected to a clock input terminal $CK_M$ of the SCN 120_1. A first terminal of the switch SW3 is connected to a second terminal of the switch SW2. A second terminal of the switch SW3 is connected to a reference voltage (for example, a ground voltage). A control terminal of the switch SW3 is controlled by the enable signal EN. Through the operation of the enable signal EN, the SCN 120_1 can be programmed into an IIR filter or FIR filter. If the enable signal EN is made to be at a low level for a narrow band, the reset operation on the summation capacitor $C_{sum}$ by the switch SW2 is disabled, so that before a next summation period, the charge is kept at the capacitor $C_{sum}$ and/or $C'_{sum}$. That is to say, when the enable signal EN is at a low level, the SCN 120_1 can be regarded as an IIR filter. The transfer function of the IIR filter in the domain z is as follows:

$$H_{IIR}(z) = \frac{\left(\dfrac{\sum_{i=1}^{M-2} C_{(M-1-i)} z^{-(i-1)}}{C_{sum} + \sum_{i=1}^{M-2} C_i}\right)}{\left(1 - \dfrac{C_{sum} z^{-(M-1)}}{C_{sum} + \sum_{i=1}^{M-2} C_i}\right)}. \quad (1)$$

If the enable signal EN is made to be at a high level for a wide band, the reset operation on the summation capacitor $C_{sum}$ by the switch SW2 is enabled, and the charge of the capacitor $C_{sum}$ and/or $C'_{sum}$ is discard before the next summation period. That is to say, when the enable signal EN is at a high level, the SCN 120_1 can be regarded as a FIR filter. The transfer function of the FIR filter in the domain z is as follows:

$$H_{FIR}(z) = \left(\frac{\sum_{i=1}^{M-2} C_{(M-1-i)} z^{-(i-1)}}{C_{sum} + \sum_{i=1}^{M-2} C_i}\right). \quad (2)$$

Therefore, the switch SW2 and the switch SW3 can be referred to as a FIR/IIR filter selection circuit. The designer can select a coefficient to design the FIR or IIR filter. In addition, according to Function (1), the control signal $V_{IIR}$ controls a resistance of the switch SW1 to change the charge stored by the capacitor $C'_{sum}$, so as to effectively change the equivalent capacitance value of the summation capacitor $C_{sum}$, thereby modulating the frequency response of the IIR filter. According to Function (1) and Function (2), the signal bandwidth is programmable. In the application of this embodiment, the FIR/IIR filter selection circuit (that is, the switches SW2 and SW3) and/or the bandwidth programming circuit (that is, the switch SW1 and the capacitor $C'_{sum}$) can be omitted according to design demands. The filtered output signal (the signal of the output terminal Iout of the SCN 120_1) is down-converted to a baseband.

According to the design demand, in some embodiments, the switch SW1 and the capacitor $C'_{sum}$ in the SCNs 120 and 130 shown in FIG. 1 might be omitted, and/or switches SW2 and SW3 in the SCNs 120 and 130 might be omitted. If the switches SW2 and SW3 in the SCNs 120 and 130 are omitted, the SCNs 120 and 130 fixedly operate in the IIR filter mode.

The SCNs 140 and 150 can be one SCN or a plurality of SCNs. For example, the implementation manner of the SCNs 140 and 150 shown in FIG. 1 can be referred to the related illustration of FIG. 2 to FIG. 4. In this case, the mode signals S1 and S2 in FIG. 1 can include a control signal $V_{IIR}$ and/or an enable signal EN. Therefore, the system can set the impulse response mode of the SCN 140 through the mode signal S1 and/or set the impulse response mode of the SCN 150 through the mode signal S2. For example, the SCNs 140 and/or 150 are set to the FIR mode or the IIR mode or bandwidths of the SCN 140 and/or 150 are adjusted.

Figure 5:
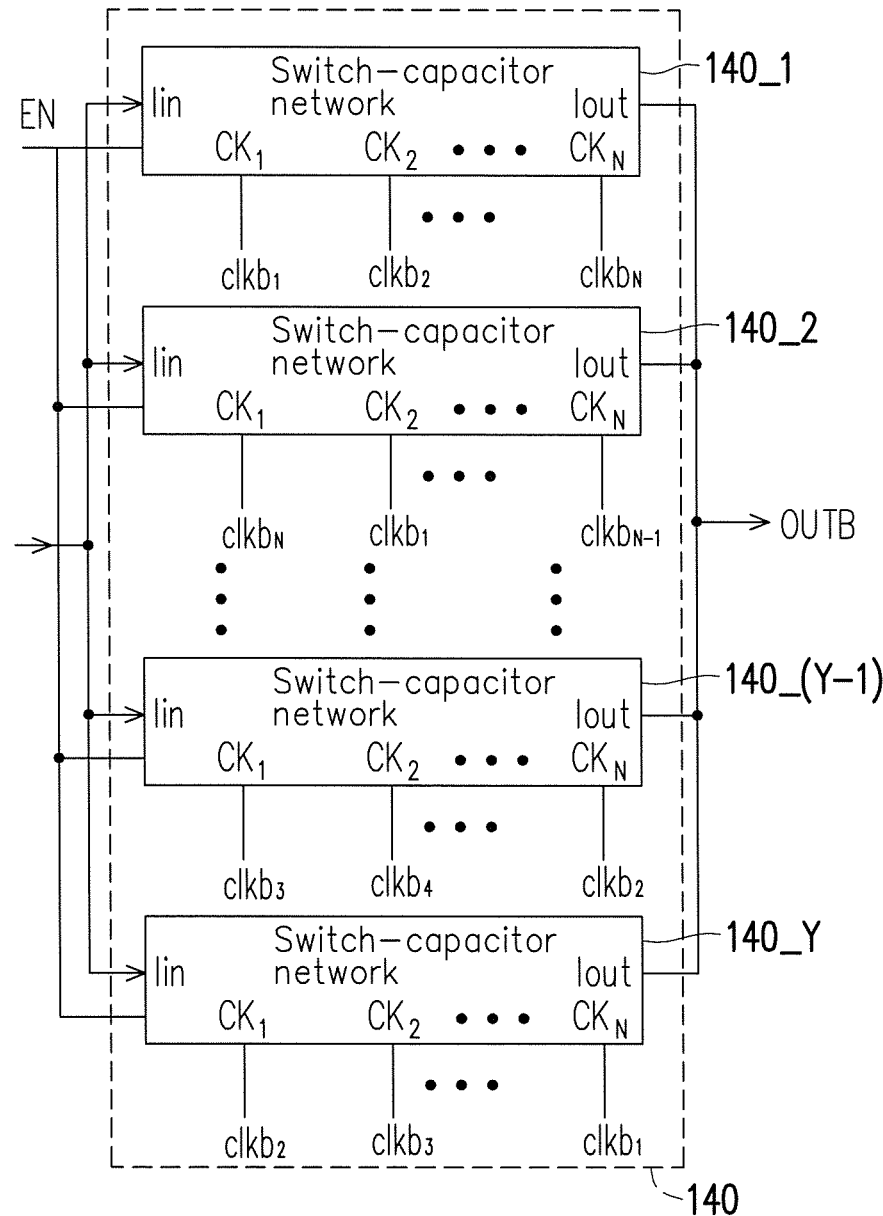
FIG. 5 is a schematic functional block diagram for illustrating an SCN 140 in FIG. 1 according to another embodiment of the disclosure.

Any SCN or any CDF can be used to implement the SCNs 140 and 150 in FIG. 1. For example, FIG. 5 is a schematic functional block diagram for illustrating SCN 140 in FIG. 1 according to another embodiment of the disclosure. The SCN 150 can be referred to the related illustration of the SCN 140. The SCN 140 includes a plurality of SCNs 140_1, 140_2, ..., 140_(Y-1), and 140_Y. In this embodiment, the number Y of the SCNs 140_Y is equal to the number N of the clock signals. In other embodiments, N can be not equal to Y. Input terminals Iin of the SCNs 140_1~140_Y are used as the input terminal of the SCN 140. The output terminals Iout of the SCNs 140_1~140_Y are used as the output terminal of the SCN 140. The SCNs 140_1~140_Y do not have to be implemented by circuits of the same type. For example, a part or all of the SCNs 140_1~140_Y can be CECDFs. By designing the structures of the SCNs 140_1~140_, the CDF 100 may generate different filtering effects.

In this embodiment, the tap-length of the SCNs 140_1~140_Y is N. That is to say, each of the SCNs 140_1~140_Y has N clock input terminals $CK_1$, $CK_2$, ..., and $CK_N$ to respectively receive the clock signals $clkb_1$~$clkb_N$. The clock generator provides the clock signals $clkb_1$~$clkb_N$ to the SCNs 140_1~140_Y, in which the clock signals $clkb_1$~$clkb_N$ have different phases. Each SCN receives the clock signals $clkb_1$~$clkb_N$ in a difference sequence. For example, the clock input terminals $CK_1$~$CK_N$ of the SCN 140_1 receive the clock signals $clkb_1$, $clkb_2$, ..., and $clkb_N$, respectively, and the clock input terminals $CK_1$~$CK_N$ of the SCN 140_2 receive the clock signals $clkb_N$, $clkb_1$, $clkb_2$, ..., and $clkb_{(N-1)}$, respectively. Similarly, the clock input terminals $CK_1$~$CK_N$ of the SCN 140_(Y-1) receive the clock signals $clkb_3$, $clkb_4$, ..., $clkb_N$, $clkb_1$, and $clkb_2$, respectively, and the clock input terminals $CK_1$~$CK_N$ of the SCN 140_Y receive the clock signals $clkb_2$, $clkb_3$, ..., $clkb_N$, and $clkb_1$, respectively.

In this embodiment, the SCNs 140_1~140_Y can be implemented in any manners, which are not limited thereto. For example, the SCNs 140_1~140_Y can be implemented according to the related illustration of FIG. 3, FIG. 6 or FIG. 8.

Figure 6:
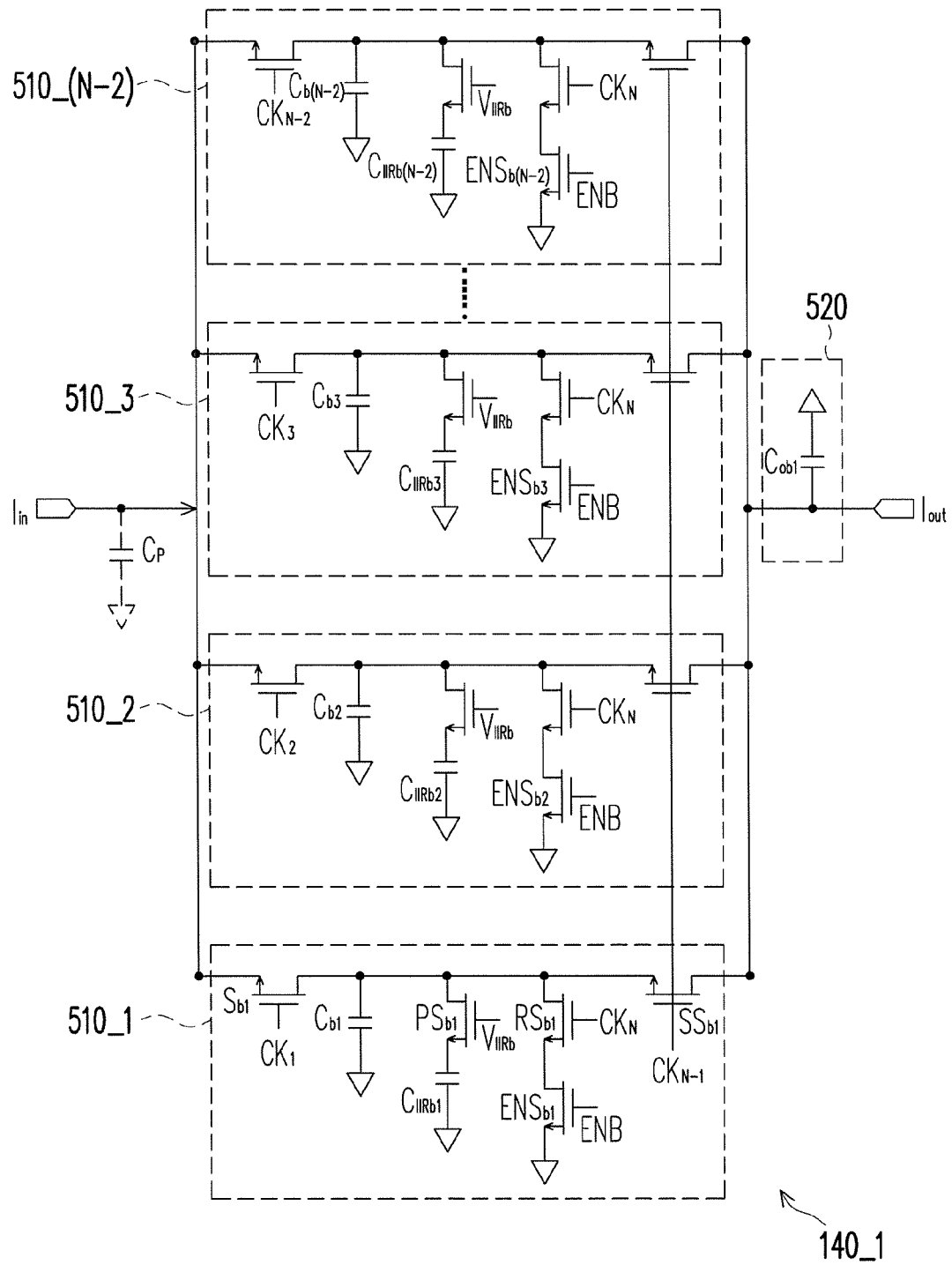
FIG. 6 is a schematic functional block diagram for illustrating an SCN in FIG. 1 according to a further embodiment of the disclosure.

FIG. 6 is a schematic circuit diagram for illustrating the SCN 1401 in FIG. 5 according to this embodiment. The implementation manners of other SCNs 140_2~140_Y can be referred to the related illustration of the SCN 140_1. The SCN 140_1 includes a plurality of sampling units 510_1~510_(N−2) and a summation unit 520. FIG. 6 shows a parasitic capacitor Cp at an input terminal Iin of the network 140_1.

The sampling terminals of the sampling units 510_1, 510_2, 510_3, . . . , and 510_(N−2) are coupled to the input terminal Iin of the network 140_1. The plurality of sampling units 510_1~510_(N−2) samples the input terminal Iin of the network 140_1 in different phases, respectively. An input terminal of the summation unit 520 is coupled to output terminals of the plurality of sampling units 510_1~510_(N−2). The summation unit 520 summates the sampling results of the plurality of sampling units 510_1~510_(N−2).

The implementation example of the sampling unit 510_1 is illustrated here. Other sampling units 510_2~510_(N−2) can be referred to the related illustration of the sampling unit 510_1 and to the disclosed contents in FIG. 6. The sampling unit 510_1 includes a sampling switch $S_{b1}$, a sampling capacitor $C_{b1}$, a switch $PS_{b1}$, a capacitor $C_{IIRb1}$, a switch $ENS_{b1}$, a reset switch $RS_{b1}$ and an output switch $SS_{b1}$. A control terminal of the sampling switch $S_{b1}$ is connected to a clock input terminal $CK_1$ of the SCN 140_1 to receive a clock signal $clkb_1$. A first terminal of the sampling switch $S_{b1}$ is coupled to the input terminal Iin of the network 140_1. The first terminal of the sampling capacitor $C_{b1}$ is coupled to the second terminal of the sampling switch $S_M$. A second terminal of the sampling capacitor $C_{b1}$ is coupled to a reference voltage (for example, a ground voltage or other fixed voltages).

In this embodiment, the mode signal S1 shown in FIG. 1 can include a control signal $V_{IIRb}$ and/or an enable signal ENB. A control terminal of the switch $PS_{b1}$ is connected to a control terminal of the SCN 140 to receive a control signal $V_{IIRb}$. A first terminal of the switch $PS_{b1}$ is coupled to a first terminal of the sampling capacitor $C_{b1}$. A first terminal of the capacitor $C_{IIRb1}$ is coupled to a second terminal of the switch $PS_{b1}$. A second terminal of the capacitor $C_{IIRb1}$ is coupled to a reference voltage.

A control terminal of the reset switch $RS_{b1}$ is coupled to a clock input terminal $CK_N$ of the SCN 140_1 to receive a clock signal $clkb_N$. A first terminal of the reset switch $RS_{b1}$ is coupled to the first terminal of the sampling capacitor $C_{b1}$. A first terminal of the switch $ENS_{b1}$ is coupled to a second terminal of the reset switch $RS_{b1}$. A second terminal of the switch $ENS_{b1}$ is coupled to a reference voltage. A control terminal of the switch $ENS_{b1}$ receives an enable signal ENB of the mode signal S1.

A control terminal of the output switch $SS_{BI}$ is coupled to a clock input terminal $CK_{N-1}$ of the SCN 140_1 to receive a clock signal $clkb_{(N-1)}$. A first terminal of the output switch $SS_{b1}$ is coupled to a first terminal of the sampling capacitor $C_{b1}$. A second terminal of the output switch $SS_{b1}$ is used as an output terminal of the sampling unit 510_1 to be coupled to the input terminal of the summation unit 520.

In this embodiment, the summation unit 520 includes a summation capacitor $C_{ob1}$. A first terminal of the summation capacitor $C_{ob1}$ is coupled to output terminals of the plurality of sampling units 510_1~510_(N−2). A second terminal of the summation capacitor $C_{ob1}$ is coupled to a reference voltage (for example, a ground voltage or other fixed voltages). In other embodiments, the implementation manner of the summation unit 520 can be referred to related illustration of the summation unit 320 shown in FIG. 3.

Figure 7:
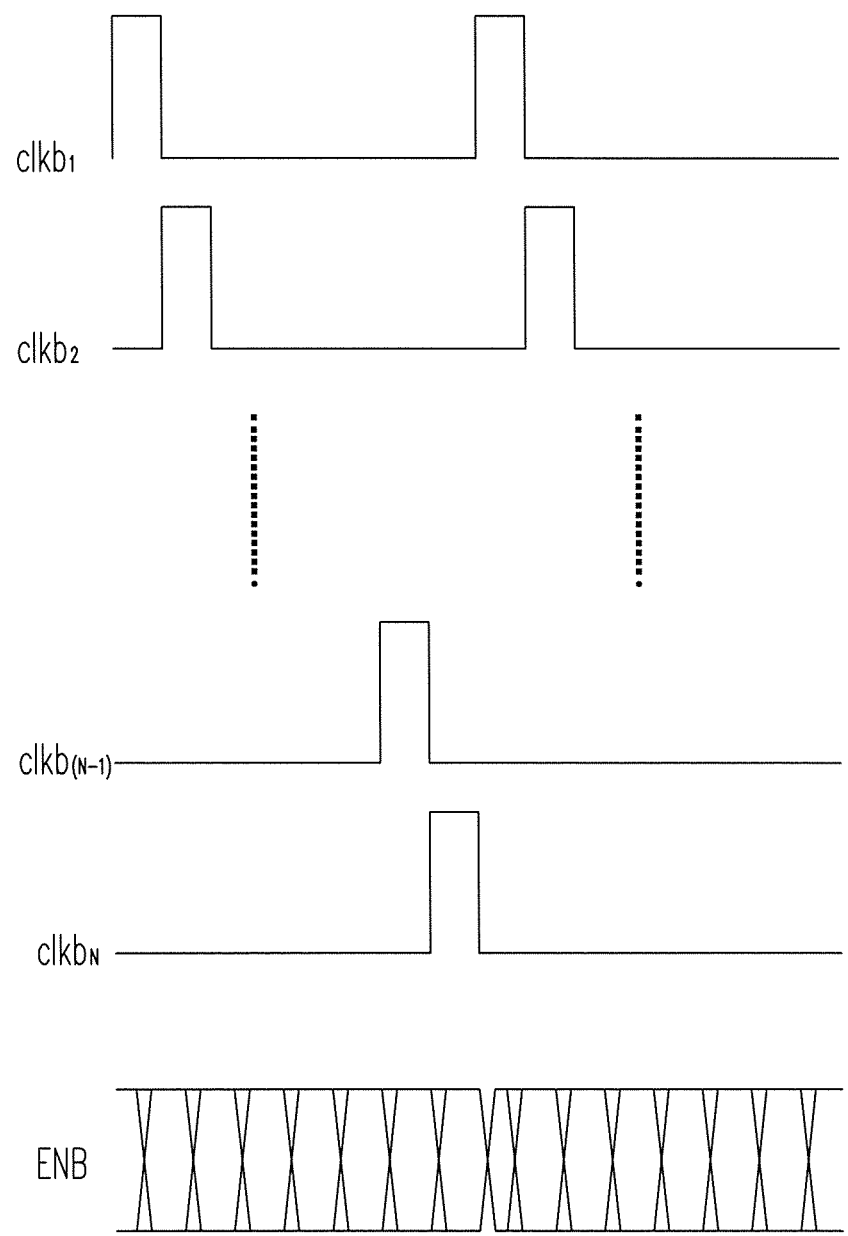
FIG. 7 is a schematic sequence chart for illustrating clock signals $clkb_1$~$clkb_N$ and an enable signal ENB in FIG. 5 according to an embodiment of the disclosure.

FIG. 7 is a schematic sequence chart for illustrating clock signals $clkb_1~clkb_N$ and an enable signal ENB in FIG. 1 and FIG. 5 according to an embodiment of the disclosure. Referring to FIG. 5 and FIG. 7, for the SCN 140_1, clock input terminals $CK_1~CK_N$ of the SCN 140_1 receive clock signals $clkb_1, clkb_2, \ldots,$ and $clkb_N$, respectively. Please refer to FIG. 6 and FIG. 7, based on the triggering of the clock signals $clkb_1~clkb_{(N-2)}$, the sampling units 510_1~510_(N−2) sample the input terminals Iin of the SCN 140_1 in turn, and saves the sampling results in the sampling capacitor. For example, the sampling unit 510_1 saves the sampling result in the sampling capacitor $C_{b1}$. Based on the reference input parasitic capacitor $C_p$, the control signal $V_{IIRb}$ is used for selecting a specified bandwidth. Based on the control signal $V_{IIRb}$, the sampling capacitance of the sampling units 510_1~510_(N−2) can be changed, thereby changing the required bandwidth.

When the sampling units 510_1~510_(N−2) all finish sampling, a clock signal $clkb_{(N-1)}$ of the clock input terminal $CK_{(N-1)}$ triggers the sampling units 510_1~510_(N−2) to output the respective sampling results to the summation unit 520. After the sampling units 510_1~510_(N−2) output the respective sampling results to the summation unit 520, the switches $ENS_{b1}, ENS_{b2}, ENS_{b3}, \ldots,$ and $ENS_{b(N-2)}$ are enabled or disabled through the control of the enable signal ENB. Each branch of the SCN 140 can perform the FIR or IIR filter. When the switches $ENS_{b1}~ENS_{b(N-2)}$ are turned on, the clock signal $clkb_{(N)}$ of the clock input terminal $CK_N$ triggers the sampling units 510_1~510_(N−2) to reset the respective sampling results to a certain initial value (for example, 0 volt). That is to say, through the operation of the enable signal ENB, the SCN 140 can also be programmed to be an IIR filter or FIR filter.

If the enable signal EN is made to be at a low level for a narrow band, the reset operation on the sampling capacitors Cb1-Cb(N−2) is disabled, so that before a next sample period, the charge is kept at the sampling capacitors Cb1-Cb(N−2) of the sampling units 510_1~510_(N−2). That is to say, when the enable signal EN is at a low level, the SCN 140 can be regarded as an IIR filter. If the ENB is at a low level (for a tunable power peak value), the switches ENSb1-ENSb(N−2) are turned off and the charge is kept at the sampling capacitors Cb1-Cb(N−2) and the capacitors CIIRb1-CIIRb(N−2). In this state, each branch of the second SCN performs memory-charge redistribution to raise the power peak value to a required level. The transfer function of the IIR filter in the domain z is as follows:

$$Hbi_{IIR\_mod\,e(z)} = \frac{V_{bi}(z)}{Iin(z)} = \frac{\left(\frac{C_p}{C_p + C_{IIRbi} + C_{bi}}\right)}{\left(1 - \frac{(C_{IIRbi} + C_{bi})z^{-N}}{C_p + C_{IIRbi} + C_{bi}}\right)}. \quad (3)$$

If the enable signal ENB is at an enable state (for example, a high level, for a fixed power peak value), the switches ENSb1-ENSb(N−2) are turned on, the clock signal $clkb_N$ of the clock input terminal $CK_N$ triggers the sampling units 510_1~510_N to reset the respective sampling result to a certain initial value (for example, 0 volt). That is to say, for the wide band, the enable signal EN is made to be at a high level, so the reset operation of the sampling capacitors Cb1-Cb(N−2) is enabled. The charge of the sampling capacitors Cb1-Cb(N−2) of the sampling units 510_1~510_(N−2) is discarded before the next sample period. When the enable signal EN is at a high level, the SCN 140 can be regarded as a FIR filter. In this state, based on the capacitor ratio, each branch of the SCN 140 performs charge redistribution to raise the power peak value to a required level. The transfer function of the FIR filter in the domain z:

$$Hbi_{FIR\_mod\,e(z)} = \frac{V_{bi}(z)}{Iin(z)} = \frac{C_p}{C_p + C_{bi}}. \quad (4)$$

Therefore, through the combination of branch weighting as shown in FIG. 6, the frequency response of the equalizer can be controlled, as Transfer Function (1) and Transfer Function (2). For example, the equalizer (SCN 140) can perform the FIR mode or IIR mode compensation, and the transfer function is as follows:

$$H_{FIR\_mod\,e(z)} = \frac{Iout(z)}{-Iin(z)} = \frac{-\left(\frac{\sum_{i=1}^{N-2} Hbi_{FIR\_mod\,e(z)(N-1-i)} Z^{-(i-1)}}{C_{Ob1} + \sum_{i=1}^{N-2} Hbi_{FIR\_mod\,e(z)}}\right)}{\left(1 - \frac{C_{Ob1} Z^{-N}}{C_{Ob1} + \sum_{i=1}^{N-2} Hbi_{FIR\_mod\,e(z)}}\right)}. \quad (5)$$

$$H_{IIR\_mod\,e(z)} = \frac{Iout(z)}{-Iin(z)} = \frac{-\left(\frac{\sum_{i=1}^{N-2} Hbi_{IIR\_mod\,e(z)(N-1-i)} Z^{-(i-1)}}{C_{Ob1} + \sum_{i=1}^{N-2} Hbi_{IIR\_mod\,e(z)}}\right)}{\left(1 - \frac{C_{Ob1} Z^{-N}}{C_{Ob1} + \sum_{i=1}^{N-2} Hbi_{IIR\_mod\,e(z)}}\right)}. \quad (6)$$

Therefore, referring to FIG. 1, FIG. 3 and FIG. 6 and Transfer Functions (1)-(6), the CDF 100 can implement the X-axis (frequency) compensation and/or Y-axis (power or gain) compensation in the frequency response graph according to the design demand. The SCNs 120 and 130 provide frequency responses to support the FIR filter or IIR filter. Due to the undesired Sinc-function distortion (from the samplers of the SCNs 120 and 130), the SCNs 140 and 150 set an impulse response mode according to the mode signal to compensate for the distortion. In some embodiments, the SCNs 140 and 150 supports the FIR filter or IIR filter according to the mode signal to provide tunable-weight coefficient to change the power level to a required frequency, so the X-axis compensation (or referred to as the frequency equalizer) is implemented. In another aspect, according to Transfer Functions (5)-(6), as the coefficients of the SCNs 140 and 150 are related to the sample frequency fs, the compensation frequency can be varied through the modulated input sampling rate, so the frequency equalizer is implemented.

In other embodiments, the SCNs 140 and 150 adjust the bandwidth of the IIR filter (or the FIR filter) according to the mode signal to change the power to a required level, so as to implement the Y-axis compensation (or referred to as the power equalizer). Therefore, this embodiment can implement the CDF 100 capable of 2-D bandwidth compensation in a frequency response graph. The CDF 100 having the bandwidth compensation can therefore meet the required bandwidth and can mitigate the Sinc-function distortion.

Figure 8:
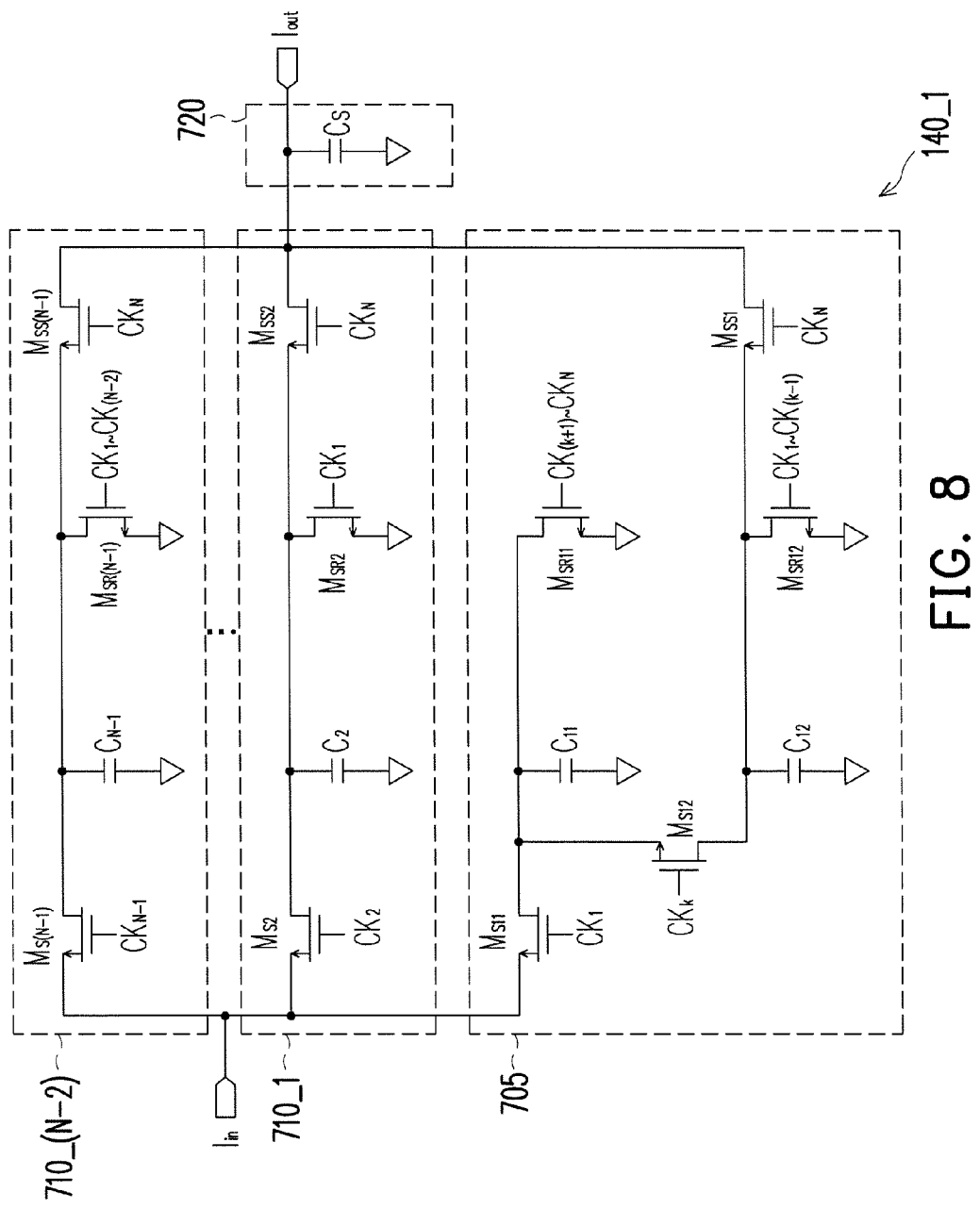
FIG. 8 is a schematic functional block diagram for illustrating an SCN in FIG. 1 according to another embodiment of the disclosure.

FIG. 8 is a schematic functional block diagram for illustrating an SCN 140 in FIG. 5 according to another embodiment. The other SCNs 140_2~140__y_ can be referred to the related illustration of SCN 140_1. The SCN 140_1 includes a sampling unit 705, a plurality of sampling units 710_1~710_(N−2) and a summation unit 720. The sampling unit 710_1 includes a sampling switch $M_{S2}$, a sampling capacitor $C_2$, a reset switch $M_{SR2}$ and an output switch $M_{SS2}$. Similarly, the sampling unit 710_(N−2) includes a sampling switch $M_{S(N-1)}$, a sampling capacitor $C_{N-1}$, a reset switch $M_{SR(N-1)}$ and an output switch $M_{SS(N-1)}$. The implementation details of the sampling units 710_1~710_(N−2) can be referred to the related illustration of the sampling unit 310_1 shown in FIG. 3. The implementation details of the summation unit 720 can be referred to the related illustration of the summation unit 320 shown in FIG. 3 and the summation unit 520 shown in FIG. 5.

Referring to FIG. 8, the sampling unit 705 includes a first sampling switch $M_{S11}$, a first sampling capacitor $C_{11}$, a first reset switch $M_{SR11}$, a second sampling switch $M_{S12}$, a second sampling capacitor $C_{12}$, a second reset switch $M_{SR12}$ and an output switch $M_{SS1}$. A first terminal of the first sampling switch $M_{S11}$ is coupled to an input terminal Iin of the network 140. A first terminal of the first sampling capacitor $C_{11}$ is coupled to a second terminal of the first sampling switch $M_{S11}$. A second terminal of the first sampling capacitor $C_{11}$ is coupled to a reference voltage (for example, a ground voltage or other fixed voltages). A first terminal of the first reset switch $M_{SR11}$ is coupled to a first terminal of the first sampling capacitor $C_{11}$. A second terminal of the first reset switch $M_{SR11}$ is coupled to a reference voltage.

A first terminal of the second sampling switch $M_{S12}$ is coupled to a first terminal of the first sampling capacitor $C_{11}$. A first terminal of the second sampling capacitor $C_{12}$ is coupled to a second terminal of the second sampling switch $M_{S12}$. A second terminal of the second sampling capacitor $C_{12}$ is coupled to a reference voltage. A first terminal of the second reset switch $M_{SR12}$ is coupled to a first terminal of the second sampling capacitor $C_{12}$. A second terminal of the second reset switch $M_{SR12}$ is coupled to a reference voltage. A first terminal of the output switch $M_{SS1}$ is coupled to a first terminal of the second sampling capacitor $C_{12}$. A second terminal of the output switch $M_{SS1}$ is coupled to an input terminal of the summation unit 720.

Figure 9:
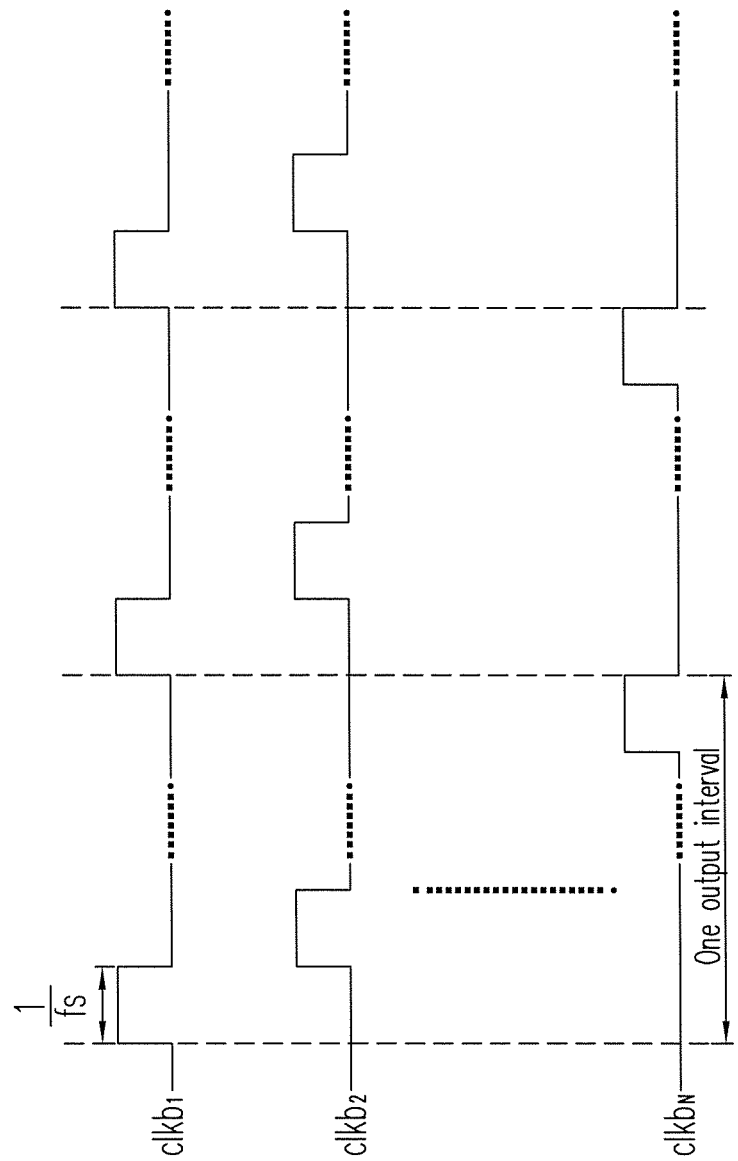
FIG. 9 is a schematic sequence chart for illustrating clock signals $clkb_1$~$clkb_N$ in FIG. 7 according to an embodiment of the disclosure.

FIG. 9 is a schematic sequence chart for illustrating clock signals $clkb_1$~$clkb_N$ received by the clock input terminals $CK_1$~$CK_N$ in FIG. 8 according to an embodiment of the disclosure. The clock signals $clkb_1$~$clkb_N$ control the actions of the switches in FIG. 8. The duty cycles of the clock signals $clkb_1$~$clkb_N$ are connected to each other but do not overlap. The width ($1/f_s$) of each duty cycle can be at least one clock phase. The clock signals $clkb_1$~$clkb_{(N-1)}$ of the clock input terminals $CK_1$~$CK_{(N-1)}$ start the sampling switch $M_{S11}$ and the sampling switches $M_{S2}$~$M_{S(N-1)}$ in turns, so that the sampling capacitor $C_{11}$ and the sampling capacitors $C_2$~$C_{N-1}$ sample the input signals received by the input terminal Iin receive in turns. The sampling switch $M_{S12}$ is controlled by the clock signal $clkb_k$ of the clock input terminal $CK_k$, in which the clock input terminal $CK_k$ selects one of the clock input terminals $CK_2$~$CK_{(N-1)}$ so that the charge of the sampling capacitor $C_{11}$ is poured to the sampling capacitor $C_{12}$ prior to a charge summation phase. The clock signal $clkb_N$ of the clock input terminal $CK_N$ provides a charge summation phase, so that the control output switches $M_{SS1}$~$M_{SS(N-1)}$ transfer the charge from the sampling capacitor $C_{12}$ and sampling capacitors $C_2$~$C_{N-1}$ to the charge summation capacitor $C_S$.

For the SCN 140_1 shown in FIG. 8, the sampling capacitor is charged/sampled immediately after the discharge. For example, the reset switch $M_{SR2}$ of the sampling capacitor $C_2$ is controlled by the clock signal clkb$_1$, whereas the sampling switch M$_{S2}$ of the sampling capacitor C$_2$ is controlled by the clock signal clkb$_2$ of the clock input terminal CK$_2$. In such a manner, the sampling capacitor C$_2$ is immediately charged/sampled at a next clock after discharge. Similarly, the reset switch M$_{SR(N-1)}$ of the SCN 710_(N–2) performs the action according to the same concept. The reset switch M$_{SR(N-11)}$ may be controlled by any clock signal in the clock signals clkb$_1$~clkb$_{(N-2)}$ of the clock input terminals CK$_1$~CK$_{(N-2)}$. The sampling capacitor C$_{N-1}$ discharges in the sampling phase of the sampling capacitor C$_{11}$ or C$_2$~C$_{N-2}$ that is charged earlier.

For the reset actions of the sampling capacitors C$_{11}$ and C$_{12}$ in the sampling unit 705, the following design is followed. The control signal of the reset switch M$_{SR11}$ is behind the clock signal clkb$_k$ of the clock input terminal CK$_k$, and in the same phase with or prior to the clock signal clkb$_N$ of the clock input terminal CK$_N$. The control signal of the reset switch M$_{SR12}$ may be in the same phase or behind the clock signal clkb$_1$ of the clock input terminal CK$_1$, and prior to the clock signal clkb$_{(k-1)}$ of the clock input terminal CK$_{(k-1)}$.

Figure 10:
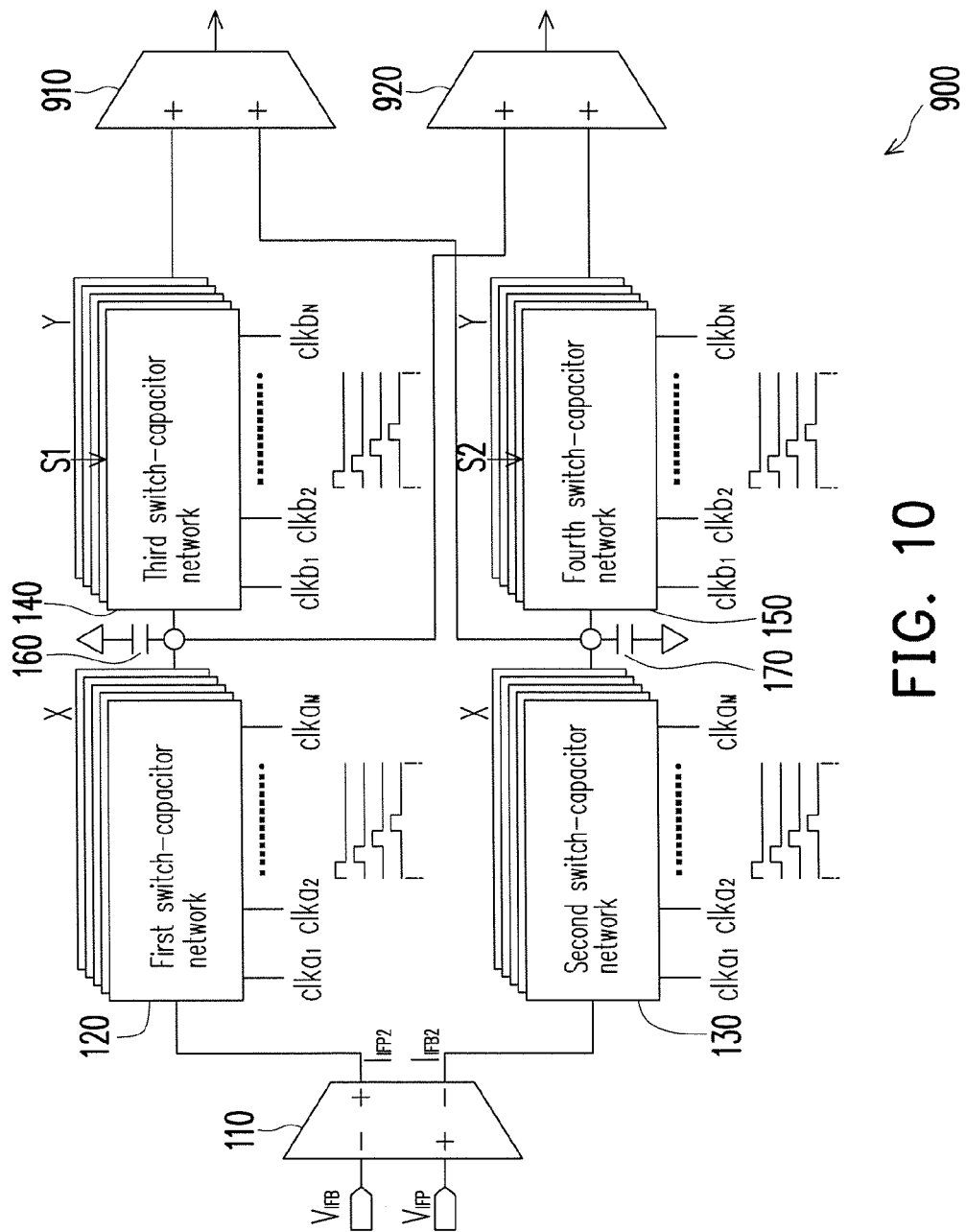
FIG. 10 is a schematic functional block diagram for illustrating a CDF according to another embodiment.

FIG. 10 is a schematic functional block diagram for illustrating a CDF 900 according to another embodiment. The CDF 900 in FIG. 10 can be referred to the related illustration of FIG. 1 to FIG. 9. Different from the embodiment of FIG. 1, the CDF 900 in FIG. 10 further includes a first output amplifier 910 and a second output amplifier 920. The first output terminal and the second output terminal of the input amplifier 110 are coupled to input terminals of the first SCN 120 and the second SCN 130, respectively. An input terminal of the third SCN 140 is coupled to the output terminal of the first SCN 120. An input terminal of the fourth SCN 150 is coupled to an output terminal of the second SCN 130.

A first input terminal of the first output amplifier 910 is coupled to an output terminal of the third SCN 140. A second input terminal of the first output amplifier 910 is coupled to an output terminal of the second SCN 130. An output tell final of the first output amplifier 910 is used as a first output terminal of the CDF 900. A first input terminal of the second output amplifier 920 is coupled to an output tell final of the fourth SCN 150. A second input terminal of the second output amplifier 920 is coupled to an output terminal of the first SCN 120. An output terminal of the second output amplifier 920 is used as a second output terminal of the CDF 900.

The input amplifier 110, the first output amplifier 910, and the second output amplifier 920 can be a TA or an OP-AMP. Compared with the CDF 100 in FIG. 1, a different compensational effect is achieved when the amplifier 910 and the amplifier 920 are added in the CDF 900.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A charge domain filter (CDF), comprising:
   an amplifier, comprising a first output terminal and a second output terminal;
   at least one first switch-capacitor network (SCN), comprising an input terminal coupled to the first output terminal of the amplifier;
   at least one second SCN, comprising an input terminal coupled to the second output terminal of the amplifier;
   at least one third SCN, wherein an input terminal of the third SCN is coupled to an output terminal of the first SCN, an output terminal of the third SCN is coupled to an output terminal of the second SCN, and a mode control terminal of the third SCN receives a first mode signal to set an impulse response mode of the third SCN; and
   at least one fourth SCN, wherein an input terminal of the fourth SCN is coupled to the output terminal of the second SCN, an output terminal of the fourth SCN is coupled to the output terminal of the first SCN, and a mode control terminal of the fourth SCN receives a second mode signal to set an impulse response mode of the fourth SCN.

2. The CDF according to claim 1, wherein the amplifier is a transconductance amplifier or an operation amplifier.

3. The CDF according to claim 1, wherein the impulse response modes of the third SCN and the fourth SCN comprise an infinite impulse response (IIR) mode or a finite impulse response (FIR) mode, and the first SCN and the second SCN support a FIR filter or an IIR filter.

4. The CDF according to claim 1, wherein sampling rates of the third SCN and the fourth SCN are different from sampling rates of the first SCN and the second SCN.

5. The CDF according to claim 1, wherein sub SCNs inside the first SCN, the second SCN, the third SCN and the fourth SCN perform time-interleaving operations to reduce a folding frequency, filter clock feed-through from the sub SCNs, and mitigate Sine-function distortion.

6. The CDF according to claim 1, wherein a network of the first SCN, the second SCN, the third SCN and the fourth SCN comprises:
   a plurality of sampling units, wherein sampling terminals of the plurality of sampling units are coupled to the input terminal of the network, and the plurality of sampling units sample the input terminals of the network through different phases, respectively; and
   a summation unit, wherein an input terminal of the summation unit is coupled to output terminals of the plurality of sampling units, and the summation unit summates sampling results of the plurality of sampling units.

7. The CDF according to claim 6, wherein one of the plurality of sampling units comprises:
   a sampling switch, comprising a first terminal coupled to the input terminal of the network;
   a sampling capacitor, coupled to a second terminal of the sampling switch;
   a reset switch, wherein a first terminal of the reset switch is coupled to the sampling capacitor, and a second terminal of the reset switch is coupled to a reference voltage; and
   an output switch, wherein a first terminal of the output switch is coupled to the sampling capacitor, and a second terminal of the output switch is coupled to the input terminal of the summation unit.

8. The CDF according to claim 6, wherein the summation unit comprises:
   a summation capacitor, coupled to the output terminals of the plurality of sampling units.

9. The CDF according to claim 8, wherein the summation unit further comprises:
   a first switch, wherein a first terminal of the first switch is coupled to the output terminals of the plurality of sampling units; and
   a first capacitance, coupled to a second terminal of the first switch.

10. The CDF according to claim 8, wherein the summation unit further comprises:
    a second switch, wherein a first terminal of the second switch is coupled to the summation capacitor; and a third switch, wherein a first terminal of the third switch is coupled to a second terminal of the second switch, a second terminal of the third switch is coupled to a reference voltage, and a control terminal of the third switch receives a mode signal.

11. The CDF according to claim 6, wherein one of the plurality of sampling units comprises:
a sampling switch, wherein a first terminal of the sampling switch is coupled to the input terminal of the network;
a sampling capacitor, coupled to a second terminal of the sampling switch;
a first switch, comprising a first terminal coupled to the sampling capacitor;
a first capacitor, coupled to a second terminal of the first switch;
a reset switch, comprising a first terminal coupled to the sampling capacitor;
a second switch, wherein a first terminal of the second switch is coupled to a second terminal of the reset switch, a second terminal of the second switch is coupled to a reference voltage, and a control terminal of the second switch receives a mode signal; and
an output switch, wherein a first terminal of the output switch is coupled to the sampling capacitor, and a second terminal of the output switch is coupled to the input terminal of the summation unit.

12. The CDF according to claim 6, wherein one of the plurality of sampling units comprises:
a first sampling switch, comprising a first terminal coupled to the input terminal of the network;
a first sampling capacitor, coupled to a second terminal of the first sampling switch;
a first reset switch, wherein a first terminal of the first reset switch is coupled to the first sampling capacitor, and a second terminal of the first reset switch is coupled to a reference voltage;
a second sampling switch, wherein a first terminal of the second sampling switch is coupled to the first sampling capacitor;
a second sampling capacitor, coupled to a second terminal of the second sampling switch;
a second reset switch, wherein a first terminal of the second reset switch is coupled to the second sampling capacitor, and a second terminal of the second reset switch is coupled to the reference voltage; and
an output switch, wherein a first terminal of the output switch is coupled to the second sampling capacitor, and a second terminal of the output switch is coupled to the input terminal of the summation unit.

13. The CDF according to claim 1, further comprising:
a second capacitor, wherein a first terminal of the second capacitor is coupled to the output terminal of the first SCN, and a second terminal of the second capacitor is coupled to a reference voltage; and
a third capacitor, wherein a first terminal of the third capacitor is coupled to the output terminal of the second SCN, and a second terminal of the third capacitor is coupled to the reference voltage.

14. The CDF according to claim 13, wherein the second capacitor and the third capacitor are parasitic capacitors.

15. A method of a charge domain filter (CDF), comprising:
providing an amplifier, at least one first switch-capacitor network (SCN), at least one second SCN, at least one third SCN and at least one fourth SCN, wherein an input terminal of the third SCN is coupled to an output terminal of the first SCN, and an input terminal of the fourth SCN is coupled to an output terminal of the second SCN;
converting an input signal into a first input signal and a second input signal with the amplifier;
sampling the first input signal with the at least one first SCN;
sampling the second input signal with the at least one second SCN;
summating an output of the first SCN and an output of the fourth SCN to obtain a first summation result;
summating an output of the second SCN and an output of the third SCN to obtain a second summation result;
sampling the first summation result with the at least one third SCN;
sampling the second summation result with the at least one fourth SCN;
setting an impulse response mode of the third SCN through a first mode signal, wherein a mode control terminal of the third SCN receives the first mode signal; and
setting an impulse response mode of the fourth SCN through a second mode signal, wherein a mode control terminal of the fourth SCN receives the second mode signal.

16. The method of the CDF according to claim 15, wherein the amplifier is a transconductance amplifier or an operation amplifier.

17. The method of the CDF according to claim 15, wherein the impulse response modes of the third SCN and the fourth SCN comprise an infinite impulse response (IIR) mode or a finite impulse response (FIR) mode, and the first SCN and the second SCN support a FIR filter or an IIR filter.

18. The method of the CDF according to claim 15, wherein sampling rates of the third SCN and the fourth SCN are different from sampling rates of the first SCN and the second SCN.

19. The method of the CDF according to claim 15, wherein sub SCNs inside the first SCN, the second SCN, the third SCN and the fourth SCN perform time-interleaving operations to reduce a folding frequency, filter clock feed-through from the sub SCNs, and mitigate Sinc-function distortion.

20. A charge domain filter (CDF), comprising:
an input amplifier, comprising a first output terminal and a second output terminal;
at least one first switch-capacitor network (SCN), comprising an input terminal coupled to the first output terminal of the input amplifier;
at least one second SCN, comprising an input terminal coupled to the second output terminal of the input amplifier;
at least one third SCN, comprising an input terminal coupled to an output terminal of the first SCN;
at least one fourth SCN, comprising an input terminal coupled to an output terminal of the second SCN;
a first output amplifier, wherein a first input terminal of the first output amplifier is coupled to an output terminal of the third SCN, a second input terminal of the first output amplifier is coupled to an output terminal of the second SCN, and an output terminal of the first output amplifier is used as a first output terminal of the CDF; and
a second output amplifier, wherein a first input terminal of the second output amplifier is coupled to an output terminal of the fourth SCN, a second input terminal of the second output amplifier is coupled to the output terminal of the first SCN, and an output terminal of the second output amplifier is used as a second output terminal of the CDF.

21. The CDF according to claim 20, wherein the input amplifier, the first output amplifier and the second output amplifier are a transconductance amplifier or an operation amplifier.

22. The CDF according to claim 20, wherein sampling rates of the third SCN and the fourth SCN are different from sampling rates of the first SCN and the second SCN.

23. The CDF according to claim 20, wherein sub SCNs inside the first SCN, the second SCN, the third SCN and the fourth SCN perform time-interleaving operations to reduce a folding frequency, filter clock feed-through of the sub SCNs, and mitigate Sine-function distortion.

24. The CDF according to claim 20, wherein a mode control terminal of the third SCN receives a first mode signal to set an impulse response mode of the third SCN, and a mode control terminal of the fourth SCN receives a second mode signal to set an impulse response mode of the fourth SCN.

25. The CDF according to claim 24, wherein the impulse response modes of the third SCN and the fourth SCN comprise an infinite impulse response (IIR) mode or a finite impulse response (FIR) mode, and the first SCN and the second SCN support a FIR filter or an IIR filter.

26. The CDF according to claim 24, wherein a network of the first SCN, the second SCN, the third SCN and the fourth SCN comprises:
    a plurality of sampling units, wherein sampling terminals of the plurality of sampling units are coupled to the input terminal of the network, and the plurality of sampling units sample the input terminal of the network through different phases, respectively; and
    a summation unit, wherein an input terminal of the summation unit is coupled to output terminals of the plurality of sampling units, and the summation unit summates sampling results of the plurality of sampling units.

27. The CDF according to claim 26, wherein one of the plurality of sampling units comprises:
    a sampling switch, comprising a first terminal coupled to the input terminal of the network;
    a sampling capacitor, coupled to a second terminal of the sampling switch;
    a reset switch, wherein a first terminal of the reset switch is coupled to the sampling capacitor, and a second terminal of the reset switch is coupled to a reference voltage; and
    an output switch, wherein a first terminal of the output switch is coupled to the sampling capacitor, and a second terminal of the output switch is coupled to the input terminal of the summation unit.

28. The CDF according to claim 26, wherein the summation unit comprises:
    a summation capacitor, coupled to the output terminals of the plurality of sampling units.

29. The CDF according to claim 28, wherein the summation unit further comprises:
    a first switch, comprising a first terminal coupled to the output terminals of the plurality of sampling units; and
    a first capacitance, coupled to a second terminal of the first switch.

30. The CDF according to claim 28, wherein the summation unit further comprises:
    a second switch, comprising a first terminal coupled to the summation capacitor; and
    a third switch, wherein a first terminal of the third switch is coupled to a second terminal of the second switch, a second terminal of the third switch is coupled to a reference voltage, and a control terminal of the third switch receives a mode signal.

31. The CDF according to claim 26, wherein one of the plurality of sampling units comprises:
    a sampling switch, comprising a first terminal coupled to the input terminal of the network;
    a sampling capacitor, coupled to a second terminal of the sampling switch;
    a first switch, comprising a first terminal coupled to the sampling capacitor;
    a first capacitance, coupled to a second terminal of the first switch;
    a reset switch, comprising a first terminal coupled to the sampling capacitor;
    a second switch, wherein a first terminal of the second switch is coupled to a second terminal of the reset switch, a second terminal of the second switch is coupled to a reference voltage, and a control terminal of the second switch receives a mode signal; and
    an output switch, wherein a first terminal of the output switch is coupled to the sampling capacitor, and a second terminal of the output switch is coupled to the input terminal of the summation unit.

32. The CDF according to claim 26, wherein one of the plurality of sampling units comprises:
    a first sampling switch, comprising a first terminal coupled to the input terminal of the network;
    a first sampling capacitor, coupled to a second terminal of the first sampling switch;
    a first reset switch, wherein a first terminal of the first reset switch is coupled to the first sampling capacitor, and a second terminal of the first reset switch is coupled to a reference voltage;
    a second sampling switch, comprising a first terminal coupled to the first sampling capacitor;
    a second sampling capacitor, coupled to a second terminal of the second sampling switch;
    a second reset switch, wherein a first terminal of the second reset switch is coupled to the second sampling capacitor, and a second terminal of the second reset switch is coupled to the reference voltage; and
    an output switch, wherein a first terminal of the output switch is coupled to the second sampling capacitor, and a second terminal of the output switch is coupled to the input terminal of the summation unit.

33. The CDF according to claim 20, further comprising:
    a second capacitor, wherein a first terminal of the second capacitor is coupled to the output terminal of the first SCN, and a second terminal of the second capacitor is coupled to a reference voltage; and
    a third capacitor, wherein a first terminal of the third capacitor is coupled to the output terminal of the second SCN, and a second terminal of the third capacitor is coupled to the reference voltage.

34. The CDF according to claim 33, wherein the second capacitor and the third capacitor are a parasitic capacitor.

35. A method of a charge domain filter (CDF), comprising:
    providing an input amplifier, at least one first switch-capacitor network (SCN), at least one second SCN, at least one third SCN, at least one fourth SCN, a first output amplifier and a second output amplifier;
    converting an input signal into a first input signal and a second input signal with the input amplifier;
    sampling the first input signal with the at least one first SCN;
    sampling the second input signal with the at least one second SCN;
    sampling an output of the first SCN with the at least one third SCN;

sampling an output of the second SCN with the at least one fourth SCN;

receiving and amplifying an output of the third SCN and the output of the second SCN with the first output amplifier, so as to provide a first output of the CDF; and receiving and amplifying an output of the fourth SCN and the output of the first SCN with the second output amplifier, so as to provide a second output of the CDF.

36. The method of the CDF according to claim 35, wherein the input amplifier, the first output amplifier and the second output amplifier are a transconductance amplifier or an operation amplifier.

37. The method of the CDF according to claim 35, wherein sampling rates of the third SCN and the fourth SCN are different from sampling rates of the first SCN and the second SCN.

38. The method of the CDF according to claim 35, wherein sub SCNs inside the first SCN, the second SCN, the third SCN and the fourth SCN perform time-interleaving operations, so as to reduce a folding frequency, filter clock feed-through from the sub SCNs, and mitigate Sinc-function distortion.

39. The method of the CDF according to claim 35, wherein a mode control terminal of the third SCN receives a first mode signal to set an impulse response mode of the third SCN, and a mode control terminal of the fourth SCN receives a second mode signal to set an impulse response mode of the fourth SCN.

40. The method of the CDF according to claim 39, wherein the impulse response modes of the third SCN and the fourth SCN comprise an infinite impulse response (IIR) mode or a finite impulse response (FIR) mode, and the first SCN and the second SCN support a FIR filter or an IIR filter.

* * * * *